US006198074B1

(12) United States Patent
Savas

(10) Patent No.: US 6,198,074 B1
(45) Date of Patent: Mar. 6, 2001

(54) SYSTEM AND METHOD FOR RAPID THERMAL PROCESSING WITH TRANSITIONAL HEATER

(75) Inventor: Stephen E. Savas, Alameda, CA (US)

(73) Assignee: Mattson Technology, Inc., Fremont, CA (US)

(*) Notice: Subject to any disclaimer, the term of this patent is extended or adjusted under 35 U.S.C. 154(b) by 0 days.

(21) Appl. No.: 08/923,661

(22) Filed: Sep. 4, 1997

Related U.S. Application Data
(60) Provisional application No. 60/025,531, filed on Sep. 6, 1996.

(51) Int. Cl.$^7$ .................................................. H01L 21/205
(52) U.S. Cl. ...................... 219/390; 219/444.1; 219/385; 118/725; 118/729; 414/935
(58) Field of Search ........................ 219/121.43, 121.51, 219/121.4, 390, 385, 388, 389, 444.1, 476, 405, 411; 392/418, 416; 118/724, 725, 723, 50.1, 728, 730, 729; 414/935, 153; 432/18, 124, 128, 132

(56) References Cited

U.S. PATENT DOCUMENTS

| 3,828,722 | * | 8/1974 | Reuter et al. ........................ 118/724 |
| 4,081,313 | | 3/1978 | McNeilly et al. . |
| 4,417,347 | | 11/1983 | Muka et al. ........................ 373/158 |
| 4,481,406 | | 11/1984 | Muka .................................. 219/411 |
| 4,496,609 | | 1/1985 | McNeilly et al. . |
| 4,507,078 | | 3/1985 | Tam et al. ............................ 432/11 |
| 4,540,876 | | 9/1985 | McGinty .............................. 219/405 |
| 4,555,273 | | 11/1985 | Collins et al. ....................... 148/1.5 |
| 4,649,261 | | 3/1987 | Sheets ................................. 219/390 |
| 4,698,486 | | 10/1987 | Sheets .............................. 250/492.2 |
| 4,794,217 | | 12/1988 | Quan et al. ......................... 437/247 |
| 4,818,327 | | 4/1989 | Davis et al. ......................... 156/345 |
| 4,857,689 | | 8/1989 | Lee . |
| 4,891,335 | | 1/1990 | McNeilly ............................. 437/247 |
| 4,898,834 | | 2/1990 | Lockwood et al. ................... 437/22 |
| 4,909,314 | | 3/1990 | Lamont, Jr. ........................ 165/80.3 |
| 4,914,276 | | 4/1990 | Blair .................................... 219/390 |
| 4,943,234 | | 7/1990 | Söhlbrand ........................... 432/152 |
| 5,001,327 | | 3/1991 | Hirasawa et al. ................... 219/390 |

(List continued on next page.)

FOREIGN PATENT DOCUMENTS

| 0 134 716 A1 | 3/1985 | (EP) . |
| 62-120475 | 11/1985 | (JP) . |
| 61-180438 | 8/1986 | (JP) . |
| 63-260016 | 10/1988 | (JP) . |
| 64-12524 | 1/1989 | (JP) . |
| 1-312834 | * 12/1989 | (JP) . |
| 2-238616 | 9/1990 | (JP) . |

OTHER PUBLICATIONS

D. Aitken et al., A New VLSI Compatible Rapid Thermal Processing System, 0168–583X/87/S03.50 Elsevier Sci. Pub. B.V.

(List continued on next page.)

Primary Examiner—John A. Jeffery
(74) Attorney, Agent, or Firm—Wilson Sonsini Goodrich & Rosati

(57) ABSTRACT

A system and method for thermally processing a substrate. A substrate is heated to a processing temperature at which the substrate is susceptible to plastic deformation or slip. An insulating cover may be removed to initially cool the substrate below such temperature before removal from the system. Gas pressure may also be adjusted to enhance heat transfer during processing and decrease heat transfer prior to removal of the substrate. Susceptors or surfaces for cooling the substrate may also be included in the system. The substrate may be transferred from a heating surface to a cooling surface by moving or rotating the substrate through warm transitional regions to avoid slip.

57 Claims, 4 Drawing Sheets

U.S. PATENT DOCUMENTS

| | | | |
|---|---|---|---|
| 5,009,590 | * 4/1991 | Mitarai et al. | 432/121 |
| 5,011,794 | 4/1991 | Grim et al. | 437/247 |
| 5,043,300 | 8/1991 | Nulman | 437/200 |
| 5,048,800 | 9/1991 | Miyazaki et al. | 266/256 |
| 5,060,354 | 10/1991 | Chizinsky | 29/25.02 |
| 5,207,573 | 5/1993 | Miyagi et al. | 432/152 |
| 5,223,305 | * 6/1993 | Tanaka et al. | 118/725 |
| 5,252,131 | 10/1993 | Kiyama et al. | . |
| 5,252,807 | 10/1993 | Chizinsky | 219/390 |
| 5,302,209 | * 4/1994 | Maeda et al. | 118/719 |
| 5,343,012 | 8/1994 | Hardy et al. | 219/443 |
| 5,387,557 | 2/1995 | Takagi | . |
| 5,429,498 | 7/1995 | Okase et al. | 432/152 |
| 5,430,271 | 7/1995 | Orgami et al. | 118/724 |
| 5,520,742 | 5/1996 | Ohkase | 118/724 |
| 5,536,918 | 7/1996 | Ohkase et al. | 219/390 |
| 5,620,560 | * 4/1997 | Akimoto et al. | 156/345 |
| 5,639,301 | * 6/1997 | Sasada et al. | 414/935 |
| 5,643,839 | * 7/1997 | Takagi | 219/390 |
| 5,667,592 | * 9/1997 | Boitnott et al. | 118/719 |
| 5,679,165 | * 10/1997 | Maeda et al. | 118/719 |
| 5,680,502 | 10/1997 | Kim | 392/416 |
| 5,695,564 | 12/1997 | Imahashi | 118/719 |
| 5,763,322 | * 6/1998 | Hagen et al. | 438/632 |
| 5,855,465 | * 1/1999 | Boitnott et al. | 414/937 |

OTHER PUBLICATIONS

F. Roozeboom, Manufacturing Equipment Issues in Rapid Thermal Processing, ISBN 0–12–247690–5, 1993 Academic Press, pp. 349–423.

A. Shimizu et al., Reduced Thermal Budget Process Using a New Concept Single Wafer Reactor, 1st Intern'l RTP Conf., RTP'93, Sep. 1993, Scottsdale, AZ, pp. 324–328.

* cited by examiner

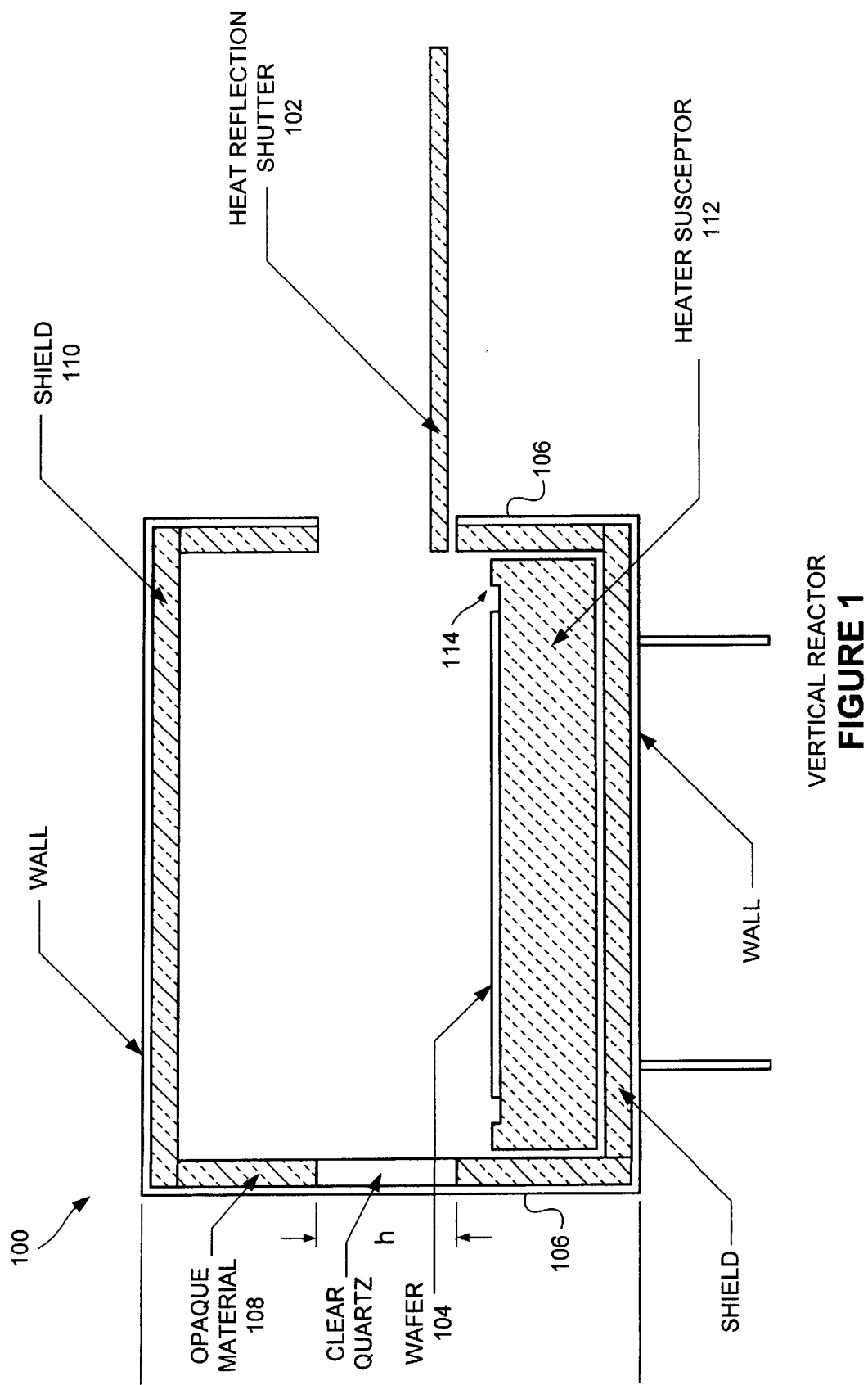
FIGURE 1 VERTICAL REACTOR

SYSTEM AND METHOD FOR RAPID THERMAL PROCESSING WITH TRANSITIONAL HEATER

REFERENCE OF THE RELATED APPLICATION

The present application claims priority from provisional application No. 60/025,531 filed Sep. 6, 1996. Provisional application No. 60/025,531 is hereby incorporated herein by reference in its entirety.

FIELD OF THE INVENTION

The field of the present invention relates in general to semiconductor processing. More particularly, the field of the invention relates to a system and method for uniformly heating and cooling a semiconductor substrate in a stable thermal processing environment.

BACKGROUND

In Rapid Thermal Processing (RTP) of semiconductor substrates, such as wafers or the like, it is advantageous to perform processes so that the wafer is exposed to the high temperature environment for a precise amount of time, and not exposed for too long to lower temperatures during ramping. Among such processes are included the ion implant annealing processes, the metal-silicide formation and growth processes, and the surface reaction and some thermal CVD processes. There are other requirements for these processes, including that the wafer temperature be very uniform during the process and that its temperature also be independent of the emissivity of its front and back surfaces. Further, it is important that there be no plastic deformation of the silicon in the wafer at any time, which means the wafer temperature must be kept uniform to a reasonable degree even after the process is done, as long as the wafer is above a critical temperature of approximately 950 degrees Centigrade. Unless all of these requirements are met at reasonable cost and with high reliability the RTP processing chamber and method is not suitable for many of these high temperature semiconductor manufacturing processes.

Most RTP systems use high intensity lamps (usually tungsten-halogen lamps or arc lamps) to selectively heat a wafer within a cold wall clear quartz furnace. Since the lamps have very low thermal mass, the wafer can be heated rapidly. Rapid wafer cooling is also easily achieved since the heat source may be turned off instantly without requiring a slow temperature ramp down. Lamp heating of the wafer minimizes the thermal mass effects of the process chamber and allows rapid real time control over the wafer temperature.

While lamp RTP systems allow rapid heating and cooling, it is difficult to achieve repeatable, uniform wafer processing temperatures using such RTP, particularly for larger wafers (200 mm and greater). The temperature uniformity is sensitive to the uniformity of the optical energy absorption as well as the radiative and convective heat losses of the wafer. Wafer temperature non-uniformities usually appear near wafer edges because radiative heat losses are greatest at the edges. During RTP the wafer edges may, at times, be several degrees (or even tens of degrees) cooler than the center of the wafer. At high temperatures, generally greater than eight hundred degrees Celsius (800° C.), this non-uniformity may produce crystal slip lines on the wafer (particularly near the edge). To minimize the formation of slip lines, insulating rings are often placed around the perimeter of the wafer to shield the wafer from the cold chamber walls. Non-uniformity is also undesirable since it may lead to nonuniform material properties such as alloy content, grain size, and dopant concentration. These nonuniform material properties may degrade the circuitry and decrease yield even at low temperatures (generally less than 800° C.). For instance, temperature uniformity is critical to the formation of titanium silicide by post deposition annealing. In fact, the uniformity of the sheet resistance of the resulting titanium silicide is regarded as a standard measure for evaluating temperature uniformity in RTP systems. in order to compensate for temperature non-uniformities, a heater with multiple independently controlled heating zones may be required. One approach is to use a multizone lamp system arranged in a plurality of concentric circles. The lamp energy may be adjusted to compensate for temperature differences detected using multi-point optical pyrometry. However, such systems often require complex and expensive lamp systems with separate temperature controls for each zone of lamps. For instance, U.S. Pat. No. 5,156,461 to Moslehi et al. discloses a multi-zone heater with sixty five tungsten-halogen lamps arranged into four heating zones. In addition, a light interference elimination system is disclosed which uses light pipes in seven dummy lamps to measure lamp radiation as well as five or more light pipes for measuring radiation across the surface of the wafer. The light interference elimination system uses the radiation of the dummy lamps to determine the fraction of total radiation from the wafer surface that is reflected from the lamps as opposed to emitted from the wafer surface. The emitted radiation can then be isolated and used to detect temperature across the wafer surface, which in turn can be used to control the lamp heating zones.

While multi-zone lamp systems have enhanced wafer temperature uniformity, their complexity has increased cost and maintenance requirements. In addition, other problems must be addressed in lamp heated RTP systems. For instance, many lamps use linear filaments which provide heat in linear segments and as a result are ineffective or inefficient at providing uniform heat to a round wafer even when multi-zone lamps are used. Furthermore, lamp systems tend to degrade with use which inhibits process repeatability and individual lamps may degrade at different rates which reduces uniformity. In addition, replacing degraded lamps increases cost and maintenance requirements.

In order to overcome the disadvantages of lamp heated RTP systems, a few systems have been proposed which use a resistively heated plate. Such heated plates provide a relatively large thermal mass with a stable temperature. In particular, one such RTP system is described and claimed in co-pending application Ser. No. 08/499,986 filed on Jul. 10, 1995 in the names of Kristian E. Johnsgard, Mattson, James McDiamid and Vladimir J. Zeitlin as joint inventors, titled "System and Method for Thermal Processing of a Semiconductor Substrate", assigned of record to the assignee of record of this application, and which is hereby incorporated herein by reference. The RTP system described in such co-pending application uses a heavily insulated large thermal mass heater. A wafer is placed on pins and lowered perpendicularly onto or near the heater for processing. During processing, the heater and wafer are enclosed within an insulated cavity at vacuum pressure. The insulation and low pressure reduce non-uniform heat losses and provide for a stable thermal processing environment. This system minimizes thermal gradients within the chamber to provide uniform thermal processing, and therefore, does not contain a separate cooling station within the chamber to allow rapid cooling of the wafer before removal from the chamber.

Rather, the wafer is removed after processing and transported to a separate cooling station.

For some processes, however, it may be beneficial to cool the wafer within the chamber before removing it. In particular, such cooling may be useful for high temperature processes where slip may occur if the wafer is removed before cooling. Throughput may also be improved in some circumstances if a cooling station can be provided within the same chamber. In providing such a cooling station, however, it is important not to introduce unacceptable thermal gradients, heat loss, and non-uniformities into the processing chamber.

One approach for providing heating and cooling within a single chamber is described in U.S. Pat. No. 5,252,807 issued to Chizinsky ("Chizinsky"). Chizinsky describes a system using a vertically elongated chamber with opposing hot and cold surfaces. The hot surface may comprise a resistively heated plate and the cold surface may comprise a surface coated with a radiation absorbing material. In Chizinsky, the wafer is moved longitudinally from proximity to the hot surface for processing followed by proximity to the cold surface for cooling.

While such a configuration provides for heating and cooling within the same chamber, a variety of disadvantages may be encountered when designing a commercial RTP chamber using such a configuration. First, the wafer temperature during processing may be dependent on the front and backside emissivities of the wafer because the wafer can radiate to the unheated side walls of the chamber and the opposing cold surface even when the wafer is near the hot surface. Second, the upper cold surface and the chamber wall may be exposed to vapors coming from the wafer during processing. Such surfaces may become coated with condensible materials from the vapors, and thus require frequent cleaning so as not to cause particulate or cross contamination on succeeding wafers when processed. Third, if a raised wall is used to prevent excessive heat loss from the edge of the wafer as it is raised (as suggested in Chizinsky) two problems may be encountered: (1) the chamber wall is exposed to direct high radiant heat from the raised wall (which results in inefficient heat loss from the raised wall) because it extends vertically well above the reflector insulating dish (which is used to protect the walls from radiation from the heating surface); and (2) the raised wall temperature is less than that of the hot surface, which is the source of its heat, and therefore detracts from the temperature uniformity of the hot surface and wafer. Thus, the wafer, hot surface, and any raised wall may radiate directly to cooled chamber walls and the opposing cold surface which results in inefficient heat loss and potential thermal gradients and non-uniformities in the thermal processing environment. Fourth, Chizinsky contemplates both heating and cooling of a wafer before the next wafer is introduced into the chamber. This results in decreased throughput relative to a system that allows the next wafer to be heated while the first wafer is being cooled.

Therefore, what is needed is a system and method for rapid thermal processing that provides (i) a stable thermal processing environment with uniform heating; (ii) a closely adjacent cooling environment insulated from direct radiation from the heating environment; and (iii) a configuration that allows stable and uniform heating and cooling in the same chamber with high throughput. In particular, such a system and method should preferably allow one wafer to be cooled while another wafer is being heated within the same chamber.

SUMMARY OF THE INVENTION

One aspect of the present invention provides a substrate processing system and method with a stable heat source with a large thermal mass. The heat source may be insulated around its edges with an insulating material, such as opaque quartz or the like, to reduce thermal gradients across the heat source. A semiconductor substrate may be placed on or near the heat source for heating. An insulating (and preferably reflective) cover (such as a shutter or hood of opaque quartz or other reflective material) may be placed over the substrate during heating such that the substrate is heated in a thermally stable, insulated cavity.

After heating, the cover may be removed to allow the substrate to radiate to a cooler environment and thereby cool to below the critical temperature for plastic deformation or slip before being removed from the chamber. The upper portion of the chamber may be lined with clear quartz or other clear material which protects the chamber walls from deposits, but allows radiation to be absorbed by the cool chamber walls or other cooling surface or environment on the other side of the clear liner.

Thus, the lower portion of the chamber is insulated with an opaque material and can be covered to provide a stable, insulated heating environment. The upper portion of the chamber provides a cooler environment and, when the insulating and/or reflective cover is removed, the substrate may be uniformly cooled to prevent plastic deformation when the substrate is removed.

Another aspect of the present invention allows heating to be augmented by the introduction of a conducting gas into the heating cavity. The gas may subsequently be pumped out and the pressure may be reduced to reduce conductive heat transfer and enhance the cooling process.

It is an advantage of these and other aspects of the present invention that thermally stable and uniform heating of a substrate within an insulated cavity can be used to heat a substrate above the critical temperature for plastic deformation (slip). The substrate may then be uniformly cooled by allowing radiation to escape from the top of the heating cavity (preferably perpendicularly from the substrate surface) to a temperature below the critical temperature for slip before the substrate is removed from the chamber.

Another aspect of the present invention provides for both heating and cooling surfaces within the same chamber. The heating and cooling surfaces may be separated by an insulating partition to prevent direct radiation from the heating surface to the cooling surface. A semiconductor substrate may be lowered (using pins, a robot arm or the like) onto or near to the heating surface for heating. An insulating cover or hood may be used to enclose the substrate in an insulated heating cavity to provide a stable environment and a conductive gas may be used to enhance heating. The cover or hood may be removed after heating to allow initial cooling. In addition, the conductive gas may be removed to reduce heating. The substrate may then be raised (by pins, a robot arm or the like) above the partition and moved laterally (by a robot arm or the like) over the cooling surface.

The substrate may then be lowered (by pins, a robot arm or the like) onto or near to the cooling surface for further cooling. Concurrently, a second substrate may be lowered onto or near to the heating surface for heating. A conductive gas may also be introduced into the chamber to enhance conductive heat transfer and thereby concurrently enhance cooling of one substrate and heating of the other substrate.

It is an advantage of these and other aspects of the present invention that both a heating and cooling surface may be provided in the same chamber without direct radiation and inefficient heat loss between the two surfaces. In addition, throughput is increased by allowing concurrent heating and cooling of semiconductor substrates.

Yet another aspect of the present invention provides a rotating, multi-wafer susceptor which allows substrates to be rotated from one processing station to another. The portions of the susceptor supporting the wafers may comprise a thin thermally conductive region (of silicon, clear quartz or the like) which allows rapid heating and cooling. There may be gaps or heat insulating material (such as opaque quartz) between the regions of the susceptor supporting different wafers to prevent heat transfer from one region of the susceptor to another.

The wafers may be loaded onto the susceptor over a warm region of the chamber at a temperature below the critical temperature for plastic deformation. The susceptor may be rotated such that the wafers are positioned over heating surfaces. As the wafers rotate, they may pass over transitional heating surfaces at intermediate temperatures. Conductive gas may then be introduced into the chamber and the susceptor may be lowered onto or near to the heating surfaces to heat the wafers. An insulating hood or cover may also be used to enclose the wafers in an insulating heating cavity as described above. After heating, the conductive gas is removed and the susceptor is raised which cools the wafers. While the susceptor is raised, new wafers may be loaded onto the portions of the susceptor over the warm regions (i.e., the portions that are not currently being heated). The susceptor is then rotated such that the heated wafers (which have now cooled to below the critical temperature) may be removed and the new wafers are positioned over the heating surfaces so they may be heated.

It is an advantage of these and other aspects of the present invention that multiple wafers may be heated to high temperatures (above the critical temperature) in a single chamber and then cooled to below the critical temperature before removal. The wafers may be rotated out of the heating region while new wafers are concurrently being rotated into the heating region which increases throughput.

BRIEF DESCRIPTION OF THE DRAWINGS

These and other features and advantages of the present invention will become more apparent to those skilled in the art from the following detailed description in conjunction with the appended drawings in which:

FIG. 1 is a side cross-sectional view of a thermal processing chamber according to a first embodiment of the present invention;

DETAILED DESCRIPTION

Figure 2A:
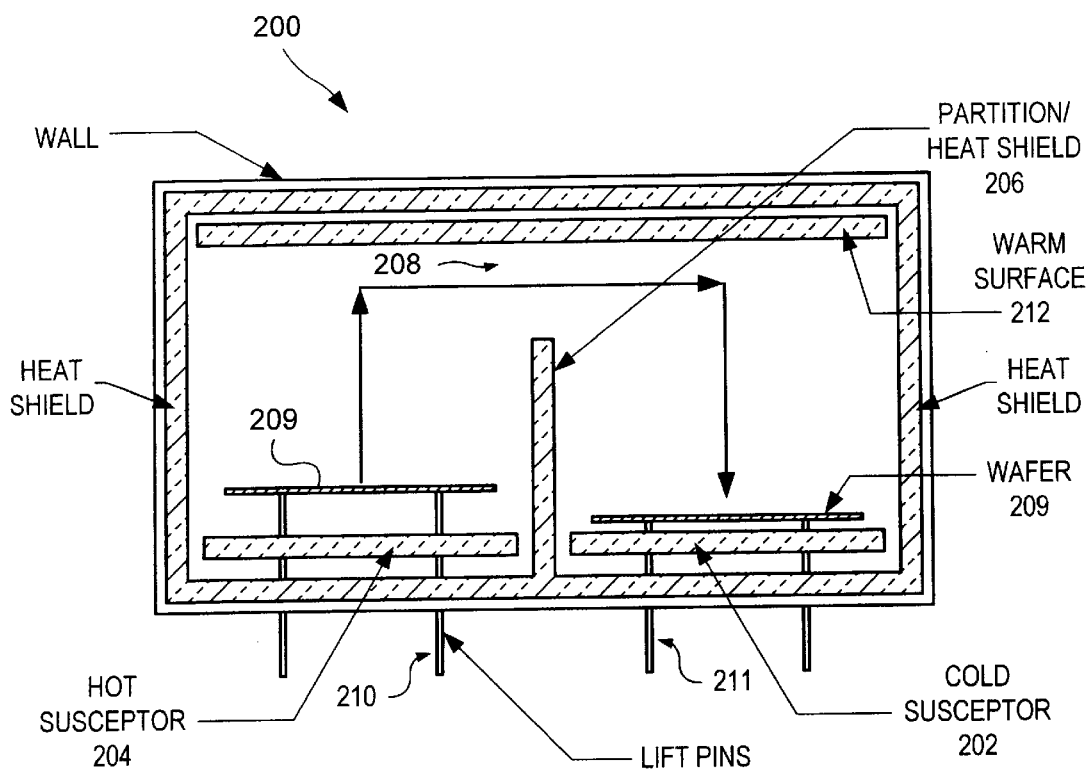
FIG. 2A is a side cross-sectional view of a thermal processing chamber according to a second embodiment of the present invention.

One aspect of the present invention allows a stable heating source to be used for rapid thermal processing. The following description is presented to enable any person skilled in the art to make and use the invention. Descriptions of specific designs are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

In the embodiments described herein, a variety of known methods may be used to construct the individual components of the thermal processing chambers. Aspects of the present invention may be used with any variety of known components, such as heaters, heating surfaces, insulating materials, reflecting surfaces, heat shields, cooling surfaces, temperature sensing and measurement devices, heater mounting mechanisms, elevational pins or robot arms, susceptors and the like, as well as similar components that may be developed in the future. The detailed configurations of many components which may be used in conjunction with the present invention are described in U.S. Pat. Nos. 5,060,354 and 5,252,807 to Chizinsky, U.S. patent application Ser. No. 08/499,986 filed on Jul. 10, 1995, in the names of Kristian E. Johnsgard, Mattson, James McDiarmid and Vladimir J. Zeitlin and assigned to the assignee of the present application, and U.S. provisional patent application No. 60/019,804 filed on Jun. 17, 1996, in the names of Kristian E. Johnsgard, Brad S. Mattson, James McDiarmid and Vladimir J. Zeitlin and assigned to the assignee of the present application, each of which is hereby incorporated herein by reference in its entirety. In particular, U.S. patent application Ser. No. 08/499,986 and U.S. provisional application No. 60/019,804 describe, among other things, the following components and methods which may be used in conjunction with aspects of the present invention: graphite heater, heater mounting mechanism, lift pins, heater insulation, insulating shroud for heating cavity, pressures and processes used for thermal processing, the use of gas at various pressures to control conductive heat transfer, methods for enhancing reflectivity of insulating walls and methods for enhancing the uniformity of thermal processing.

FIG. 1 is a side cross-sectional view of a thermal processing chamber, generally indicated at 100, according to a first embodiment of the present invention. This chamber has several features which allow it to avoid the problems found in other processing systems and therefore be commercially useful and cost effective.

1) To avoid emissivity dependent wafer temperature during high temperature treatment a very effective heat insulating and reflection shutter 102 is inserted into the chamber above the wafer 104. The side walls of the chamber 106 are also lined with efficient thermal insulating material 108 such as opaque quartz or other materials compatible with ultra-clean silicon processing such as silicon or silicon carbide. These prevent the wafer from radiating directly to the colder walls and opposing surface. The top of the chamber can be lined with any of these materials but preferably a clear quartz shield 110 or other clear material which allows radiant energy to escape from the chamber more quickly after heating.

2) Because of the superior heat insulation the height of the chamber may be reduced such that it is not elongated, which reduces the size and cost of the chamber and reduces the amount of time for wafers to be moved to and from the hot and, if desired, colder surfaces. The height of the chamber in the first embodiment may range from as little as one half the wafer diameter, or as much as three times the diameter (ranging anywhere from 100 to 600 mm for a 200 mm wafer and from 150 to 900 mm for a 300 mm wafer).

3) The chamber is filled during high temperature processing with Helium or other thermally conductive gas or gases to a pressure (from a few Torr to one atmosphere or at any range subsumed therein) that is sufficient to conduct heat well from the susceptor 112 to the wafer. Because of improved thermal conduction the gas reduces the time it takes to heat the wafer to process temperature and causes the wafer temperature to more closely equal the temperature of the hot surface of susceptor 110. Preferably the pressure should not exceed the convection limit of the gas in the process chamber to minimize the convective heat transport from the wafer to the walls which cools the wafer. This is the case for pressures in the above indicated range when the gas is Helium or Hydrogen because they have higher limits than virtually all other gases.

The combined effect of insulating shutter, gas conduction and the thermal insulation on the side walls of the chamber is to cause the wafer temperature to be quite close to that of the susceptor, and is expected to be sufficiently independent of the emissivities of the front and back sides of the wafer to meet manufacturing requirements for current and next generation semiconductor devices (less than or equal to 0.35 Microns).

4) Use of the quartz or other easily exchanged shields 108 and 110 on the side and top walls of the chamber permits the metal walls to be kept cleaner and require less maintenance, since the shields can be removed and replaced quickly. Otherwise there could be condensation on the metal walls 106 of volatile species which evolve from the wafers during high temperature process which must be frequently cleaned off. In addition, use of heat shields around the sides of the chamber help in maintaining the uniformity of the susceptor and wafer temperatures since they reduce the heat flow from the hot surface to the walls and thus the heat loss rate from the edges of the hot surface and from the wafer. Liners and heat shields to which the wafer is directly exposed may be multilayered so as to improve efficiency. Shields are not necessarily very thick for insulating quality, but are preferably at least a few millimeters if opaque quartz and a half millimeter if silicon or silicon carbide.

5) The wafer, during high temperature processing, may sit on the susceptor or on very short standoffs such that it doesn't touch the hot surface directly. These standoffs, which may be quartz or silicon, can extend as far as a few thousandths of an inch to as much as a millimeter above the hot surface which may, in some embodiments, be made of carbon-containing materials such as graphite or silicon carbide, which could transfer carbon, a contaminant, to the wafer.

The fact that the wafer doesn't touch the hot surface helps reduce thermal contortions of the wafer as it heats, and controls the heating rate due to conduction relative to that due to radiation. Standoffs work very well in conjunction with gas conduction for supplemental heat transfer to the wafer.

6) By putting two of these chambers side by side two wafers at once can be loaded using the robotic wafer handling system of the Mattson Aspen™ platform, available from Mattson Technology, Inc. This allows two wafers at once to be processed in adjacent chambers and by being able to use the same gas supply, control system and robot which reduces the cost of the process.

7) The dimensions of the chamber are preferably suitable for processing 100 mm, 125 mm, 150 mm, 200 mm or 300 mm wafers. Therefore, the chamber diameter is preferably at least 1.5 times the wafer diameter in both dimensions and should have a height between one third and three times the wafer diameter. The hot plate is preferably at least 10% larger than the wafer diameter and more preferably 40% to 50% greater in diameter in order that the temperature be sufficiently uniform to make the wafer temperature uniform.

8) In the first embodiment, there is a slight to modestly raised edge 114 on the top surface of the susceptor at a diameter slightly greater than the wafer diameter (see FIG. 1) such that the edge of the wafer is shielded from the side wall of the chamber in the horizontal direction to prevent excessive or nonuniform heat loss.

9) The chamber walls should be made of metal such as aluminum that permits them to be cooled by water or other active coolant. The top surface should be cooled as well as the sides and bottom of the chamber to prevent the metal from reaching temperatures such that metal vapor is created at any measurable rate since this would contaminate the wafers.

10) A raised wall may be put at the edge of the heater (similar to that described in Chizinsky as discussed in the Background Section above), but an independent heat supply is preferably provided to it—preferably at its base—so that its temperature where it meets the hot surface of the susceptor is not substantially less than the temperature at the center of the heating surface. In this case, the temperature of the wall will drop as a function of the distance above the hot surface of the susceptor. This can be controlled by the thickness of the wall and quality of insulation between the heated portion of the wall and the outer wall of the process chamber. The temperature gradient on the wall can thus be controlled so that it matches or exceeds the center temperature of a wafer as it is raised on pins above the hot surface. This permits the reduction of temperature gradients on the wafer as it is raised above the heater.

11) An exemplary process sequence is as follows:

A. When the high temperature wafer processing is complete the temperature of the wafer needs to be lowered without causing large thermal gradients in the wafer, and thus plastic deformation (slip). To do this we pump out the conducting gas and withdraw the heat insulating shutter from the process chamber which cause the wafer temperature to be lowered to near or below the slip threshold due to reduced conduction from the hot surface and increased radiative loss to the top of the chamber.

B. Once the above actions are done the wafer may be raised up on lift pins (which may extend through the susceptor), cooling it still more since the solid angle represented by the hot surface decreases. If necessary, the wafer can be further cooled before removal from the hot environment within the processing chamber by re-inserting the shutter below the wafer, which intercepts most of the radiation from the hot surface of the susceptor and greatly reduces the heat flux to the wafer permitting it to then be lowered to the level of the removal slot and taken out of the chamber. It can then be cooled to a low temperature for removal from the overall processing system in another chamber in a conventional manner. This permits more wafers to be processed per hour since the final cooling to low temperature can be done in a much less expensive environment than the heated chamber, while still within the processing system, and allowing another wafer to be moved more quickly into the processing chamber.

The overall processing system may comprise, for example, a cluster of chambers at reduced pressure with a robot for wafer transfer between the chambers as in the Aspen™ system available from Mattson Technology, Inc.

In this design the wafer is more rapidly (and thus less expensively) cooled than in many conventional designs. In some proposed conventional designs the wafer would be moved longitudinally from a hot surface to an opposing cold surface which may require complex wafer manipulation to rotate the wafer so its backside can be placed adjacent to the cold surface. Such complex manipulation may be required in such a conventional design because the processed side of the wafer should not contact or be too close to any surface to avoid contamination. No such problem is encountered in the chamber according to the first embodiment.

Thus, the first embodiment enables the requirements of high temperature thermal processing to be achieved at commercially economical cost of processing. For this to be achieved, the cost per wafer is reduced by increasing the number of wafers per hour processed in the chamber, while the size of the machine is reduced to reduce the floor space utilization in the very expensive clean room factory.

Figure 2B:
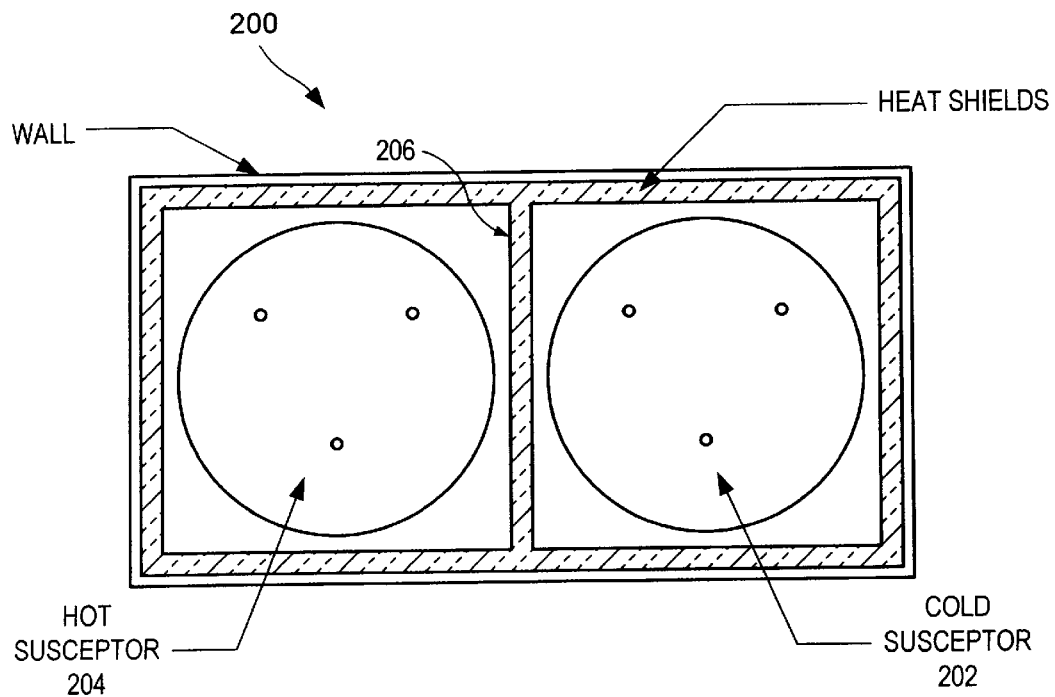
FIG. 2B is a top view of a thermal processing chamber according to the second embodiment.

FIG. 2A is a side cross-sectional view of a thermal processing chamber, generally indicated at 200, according to a second embodiment of the present invention, and FIG. 2B is a top view of chamber 200. As shown in FIGS. 2A and 2B the process chamber 200 need not have a wafer cooling surface. Rather, a cold susceptor 202 can be placed in the same chamber as a hot susceptor 204 while maintaining many of the benefits of the first embodiment.

1) The cold susceptor may be adjacent to the hot susceptor with an insulating partition or heat shield 206 between the two which blocks the direct line of sight from the hot susceptor to the cold one. FIG. 2 shows a configuration in which there is an opening 208 at the top of this partition for the wafer 209 to be transported from the hot region to the cold. The cold susceptor may not be directly adjacent to the hot susceptor and may in fact be in any variety of planes parallel to the hot surface (without being directly above or below it or in direct line of sight).

2) When we put the just-processed wafer on the cooled surface we can have the chamber filled with conductive gas which significantly improves the rate of cooling of the wafer and reduces its equilibrium temperature. It saves time relative to a conventional design with opposing hot and cold surfaces because the wafer need not be rotated before contacting or being placed proximate to the cold surface. Furthermore, when this processed wafer is being cooled we can insert a fresh wafer onto lift pins 210 directly over the hot susceptor for concurrent heating.

3) In this invention the inner surface of the insulator lining the top and sides of the chamber is warm - anticipated to be between 100 to 300 degrees Centigrade cooler than the heating surface of the hot susceptor. The reduced rate of heat radiation from the wafer along with the optional use of conducting gas (as in the first embodiment) prevents the wafer temperature from being unacceptably dependent on its emissivity. When the wafer is processed over the hot susceptor while the chamber is filled to a significant pressure (from one Torr to an atmosphere or any range subsumed therein) of high conductivity gas such as Helium or Hydrogen the fact that a substantial fraction of the heat transported to the wafer is not dependent on the wafer's emissivity makes the wafer temperature even more nearly independent of its emissivity.

4) As in the first embodiment the wafer, during high temperature processing, may sit on very short standoffs such that it does not touch the heating surface of the susceptor directly. These standoffs, which may be quartz or silicon, can extend from a few thousandths of an inch to as much as a millimeter above the hot surface. The fact that the wafer doesn't touch the hot surface helps reduce thermal contortions of the wafer as it heats, and controls the heating rate due to conduction relative to that due to radiation. This permits us to ramp the temperature of the wafer in a controlled way when we use supplemental gaseous conduction and also avoid potential contamination by materials from the hot surface. In some embodiments, this hot surface may be made of carbon containing materials such as graphite or silicon carbide, which could transfer carbon, a contaminant, to the wafer so standoffs may be desirable.

5) By making the top warm surface 212 be at nearly the same temperature as the side walls of the hot chamber it will make the temperature variation of the susceptor smaller and the wafer temperature more uniform. However, the temperature of the warm surface in the regions which have a viewing angle to the cold surface will be lower than that area of the upper surface which only views the hot surface. Therefore, to achieve good wafer temperature uniformity and reduced emissivity dependence, it is desirable to either improve the shielding in the walls above the cooler regions of the warm surface, or employ active heating in those regions to make its temperature reasonably uniform.

6) By putting two of these dual compartment chambers side by side, with or without an insulating partition between the pairs, two wafers at once can be loaded using the robotic wafer handling system of the Mattson Aspen™ platform available from Mattson Technology, Inc. This allows two wafers at once to be processed in adjacent hot regions, and then in adjacent cold regions, and by using the same gas supply, control system and robot reduce the cost of the process.

7) The process sequence would be first to load wafers from the supply onto lift pins 210 in the hot region over the hot susceptor 204 (or adjacent regions in the Aspen™ platform) and lower the wafers to proximity to the hot surface of the hot susceptor 204 as the gas pressure is adjusted for the desired heat transfer. When the wafers are done heating the gas pressure is reduced by pumping and the wafers are then raised on lift pins 210. A robot moves these wafers to the pins 211 of the cold region and they are lowered to proximity to the cold surface of the cold susceptor 202 as the pressure is again raised. The new wafers to be processed are concurrently inserted directly into the hot region and onto the pins 210. They are then lowered onto or near to the heating surface while the other wafers are cooling. When the original wafers are sufficiently cooled, they are raised on pins 211 and removed. This sequence is repeated to achieve high throughput.

This design is expected to meet the requirements of commercial RTP for semiconductor wafers including: wafer temperature uniformity due to the improved uniformity of the temperature of the environment as seen from the wafer; wafer temperature independent of its emissivity on front and backsides; avoidance of plastic deformation of the wafer due to excessive thermal gradients; low cost of process and ownership due to rapid process cycle time, reduced maintenance, and increased throughput per floor space of the semiconductor fabrication facility.

Figure 3A:
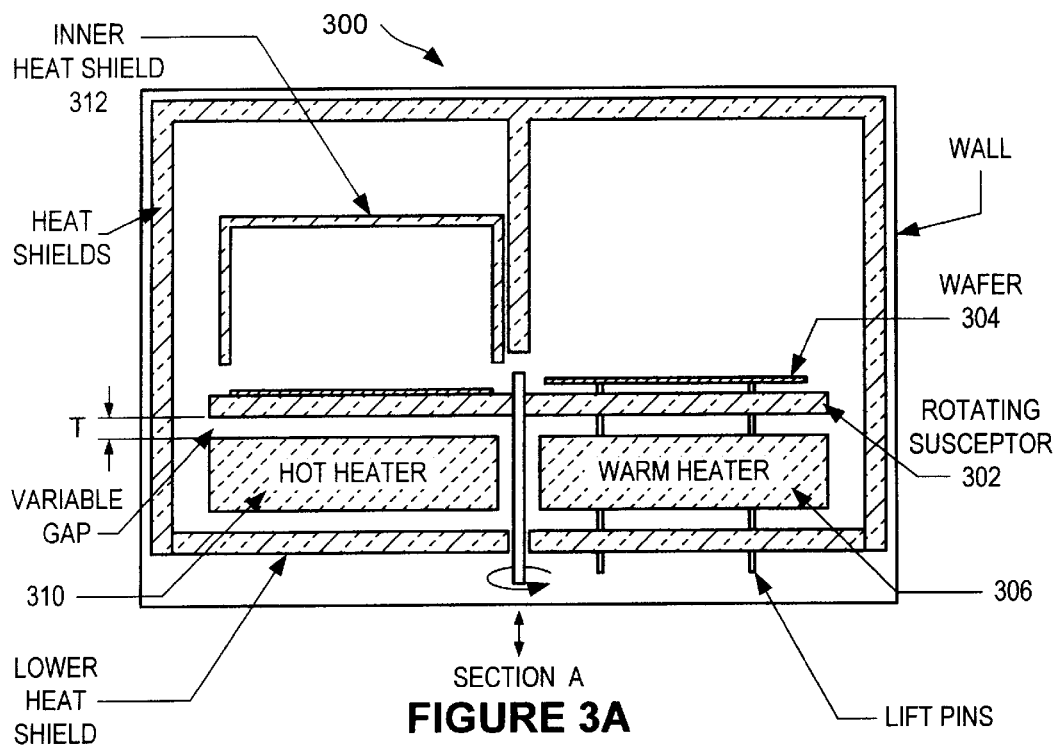
FIG. 3A is a side cross-sectional view of a thermal processing chamber according to a third embodiment of the present invention.
Figure 3B:
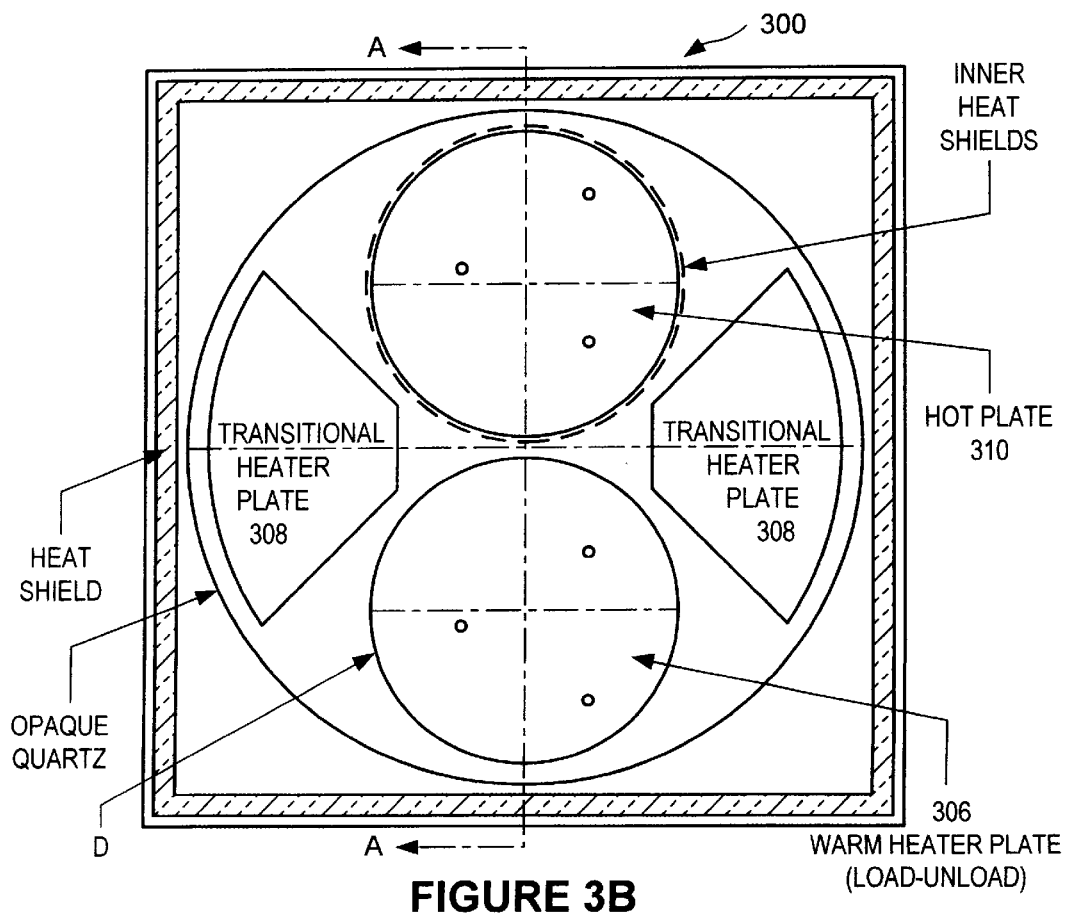
FIG. 3B is a top view of a thermal processing chamber according to the third embodiment.

FIG. 3A is a side cross-sectional view, and FIG. 3B is a top view, of a thermal processing chamber, generally indicated at 300, according to a third embodiment of the present invention. The chamber 300 incorporates a rotating susceptor 302 which allows a wafer 304 to be easily rotated into and out of processing regions.

Figure 4A:
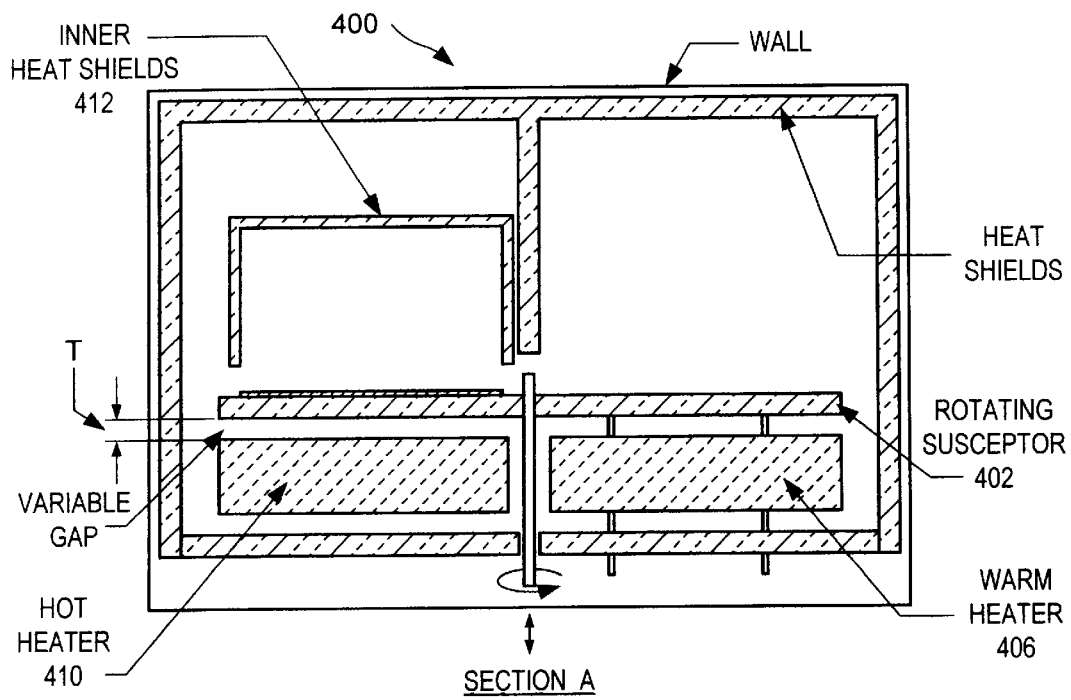
FIG. 4A is a side cross-sectional view of a thermal processing chamber according to a fourth embodiment of the present invention.
Figure 4B:
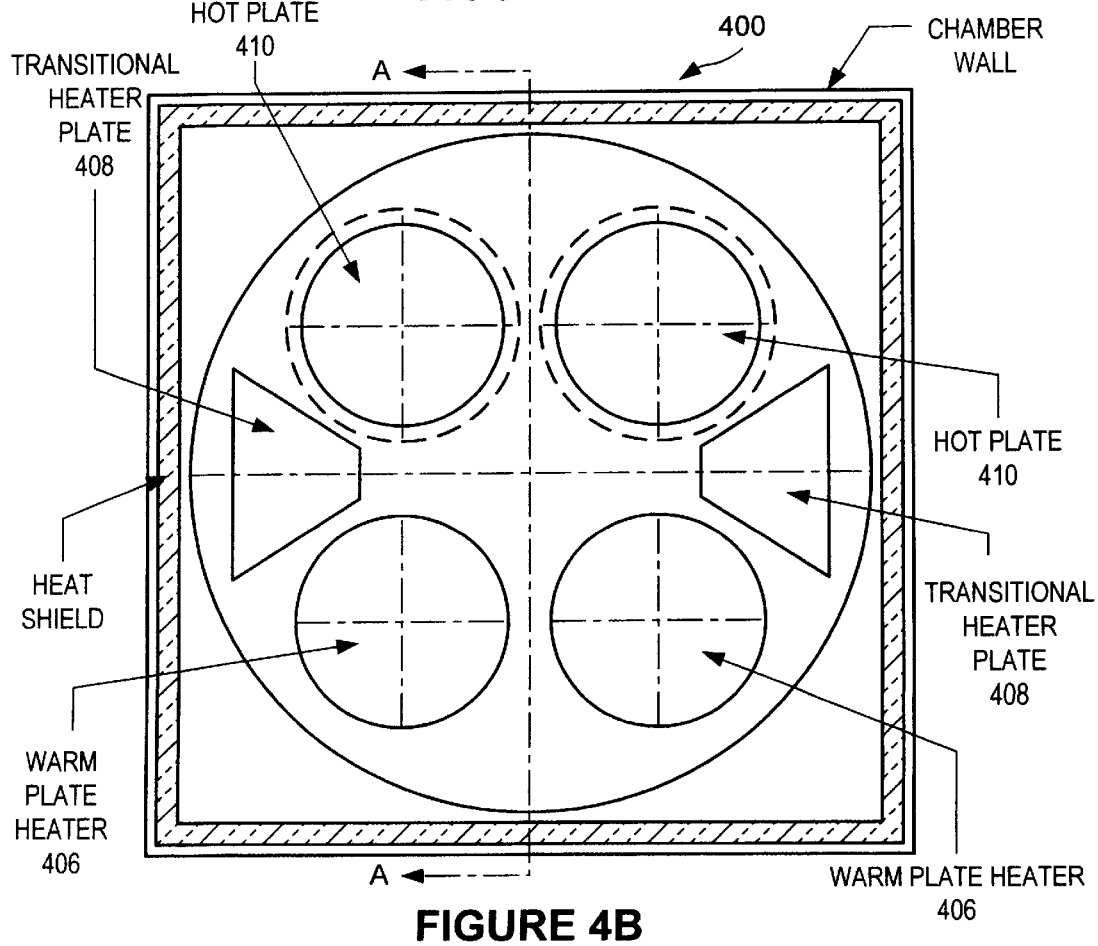
FIG. 4B is a top view of a thermal processing chamber according to the fourth embodiment.

FIG. 4A is a side cross-sectional view, and FIG. 4B is a top view, of a thermal processing chamber, generally indicated at 400, according to a fourth embodiment of the present invention. The chamber according to the fourth embodiment is similar to the third embodiment in that it also uses a rotating susceptor 402; however, in the fourth embodiment two wafers may be loaded onto the susceptor and rotated into and out of processing regions for concurrent processing of two wafers at a time.

1) The wafer 304 (or wafers as in the Aspen™ dual wafer loading system for FIGS. 4A and 4B) is first loaded onto the susceptor above the "warm" heater 306 (406 in FIG. 4). Here it is warmed to 100 to 300 degrees Centigrade below the desired process temperature. When it is placed on the susceptor 302 the wafer 304 heats by radiation. The susceptor may be thin (with dimension T shown in FIGS. 3 & 4 preferably being from 2 to 10 mm) which facilitates conduction from heater to susceptor.

2) The walls of the chamber are all lined with thermal insulating material, either quartz, opaque quartz, silicon or silicon carbide. These liners provide protection of the metal walls of the process chamber from condensible species evolved from the wafers during process, and they provide ease of cleaning since clean liners can be quickly swapped in and out of the chamber during maintenance periods.

3) If desired, the process chamber may be filled to a moderate to high pressure (1 Torr to 1 Atmosphere or any range subsumed therein) of conducting gas such as Helium or Hydrogen and thus allow heating both by gaseous conduction and radiation (as described for the first and second embodiments). The use of the gas also increases the heating rate of the susceptor which speeds the rate of heating of the wafer.

4) The susceptor in the third and fourth embodiments may comprise opaque or transparent quartz, or silicon which means that there is no problem with wafer contamination. Use of silicon promotes faster heat transfer since it has a higher emissivity.

5) Once the wafer is warmed the susceptor is raised slightly and rotated so that the wafer first moves over the intermediate temperature transitional heater plate 308 (408 in FIG. 4) to raise its temperature gradually and then finally over the hot plate 310 (410 in FIG. 4) process station. This rotation is done with the susceptor in the "up" position which causes the wafer to be heated slowly as it rotates. When the wafer is in position above the hot plate 310 the susceptor 302 is lowered which causes the susceptor to be further heated by gaseous conduction and in turn to heat the wafer to full process temperature.

6) The use of an inner heat shield 312 (412 in FIG. 4) around and above the hot processing stations, which is either a covered insulating cylinder or other symmetrical shape placed symmetrically with respect to the wafer and heater, improves the uniformity of the wafer temperature. It also makes the temperature of the environment seen by the wafer closer to the temperature of the wafer. The use of such an insulated heating cavity and the use of gaseous conduction greatly reduce the dependence of the wafer temperature on the emissivities of the wafer surfaces.

7) When the wafer is to be removed from the chamber the susceptor is again raised and if necessary or desired the gas is pumped from the chamber which cools the wafer. The fact that the susceptor is relatively thin allows the wafer to cool rapidly to a temperature close to or below the plastic deformation threshold once the susceptor is lifted away from the hot plate 310. The wafer is then sufficiently cool to be rotated out of the hot process region, across the transitional heater plate 308, to the warm plate 306 for unloading. The wafer thereby cools gradually without suffering plastic deformation as it rotates over the progressively lower temperature regions prior to unloading.

As with the other embodiments described above, a new wafer (or wafers in FIG. 4) may be loaded prior to removal of the heated wafer (or wafers in FIG. 4). The new wafer is loaded onto the susceptor over the warm plate 306 while the processed wafer remains over the hot plate 310. The new wafer is rotated into processing position over the hot plate 310 while the processed wafer is rotated out of processing position to the warm plate 306 where it may be unloaded without plastic deformation.

It will be readily apparent to those of ordinary skill in the art that the above techniques may be applied in any variety of thermal processing systems and methods. While this invention has been described and illustrated with reference to particular embodiments, the scope of the present invention is not limited to the disclosed embodiments but, on the contrary, is intended to cover numerous other modifications and equivalent arrangements which are included within the spirit and scope of the following claims.

What is claimed is:

1. A thermal processing system for processing a semiconductor substrate comprising:
   a processing chamber;
   a heated surface within the processing chamber for heating the substrate for processing at a processing temperature;
   a support for positioning the substrate adjacent to the heated surface for processing;
   a transitional heater within the processing chamber providing a transitional region with a temperature less than the processing temperature; and
   a robot for removing the substrate from the support after processing;
      wherein the robot is configured to remove the substrate from the region adjacent to the heated surface horizontally along a plane substantially parallel to the heated surface and through the transitional region.

2. The thermal processing system of claim 1 wherein the transitional heater comprises an active heater.

3. The thermal processing system of claim 1 wherein the transitional heater comprises thermal insulation.

4. The thermal processing system of claim 1 further comprising a second surface having a temperature less than the transitional heater and a second support for positioning the substrate adjacent to the second surface after processing,
   wherein the robot places the substrate on the second support for cooling after removing the substrate from the region adjacent to the heated surface through the transitional region.

5. The thermal processing system of claim 4, wherein the processing temperature is at least 800 degrees Celsius and the temperature of the transitional region is from about 100 to 300 degrees Celsius less than the processing temperature.

6. The thermal processing system of claim 5, further comprising a gas supply for providing gas to the processing chamber and an exhaust for removing gas from the processing chamber;
   wherein the gas supply provides a conductive gas to the processing chamber for processing; and
   wherein the exhaust removes at least a portion of the conductive gas after processing and prior to the removal of the substrate by the robot.

7. The thermal processing system of claim 1, wherein the processing temperature is at least 800 degrees Celsius.

8. The thermal processing system of claim 1, wherein the temperature of the transitional region is from about 100 to 300 degrees Celsius less than the processing temperature.

9. The thermal processing system of claim 1, further comprising a gas supply for providing gas to the processing chamber and an exhaust for removing gas from the processing chamber;
   wherein the gas supply provides a conductive gas to the processing chamber for processing; and
   wherein the exhaust removes at least a portion of the conductive gas after processing and prior to the removal of the substrate by the robot.

10. A thermal processing system for processing a semiconductor substrate comprising:
    a processing chamber;
    a heated surface within the processing chamber for heating the substrate for processing at a processing temperature;
    a transitional heater within the processing chamber providing a transitional region with a temperature less than the processing temperature; and
    a movable support for positioning the substrate adjacent to the heated surface for processing and for removing the substrate from the region adjacent to the heated surface after processing;
       wherein the moveable support is configured to remove the substrate from the region adjacent to the heated surface horizontally along a plane substantially parallel to the heated surface and through the transitional region.

11. The thermal processing system of claim 10 wherein the transitional heater comprises an active heater.

12. The thermal processing system of claim 10 wherein the transitional heater comprises thermal insulation.

13. The thermal processing system of claim 10 further comprising a second surface having a temperature less than the transitional heater,
    wherein the moveable support positions the substrate adjacent to the second surface after removing the substrate from the region adjacent to the heated surface through the transitional region.

14. The thermal processing system of claim 10, wherein the moveable support comprises a rotatable susceptor.

15. The thermal processing system of claim 14, wherein the processing temperature is at least 800 degrees Celsius and the temperature of the transitional region is from about 100 to 300 degrees Celsius less than the processing temperature.

16. The thermal processing system of claim 15, further comprising a gas supply for providing gas to the processing chamber and an exhaust for removing gas from the processing chamber;
    wherein the gas supply provides a conductive gas to the processing chamber for processing; and
    wherein the exhaust removes at least a portion of the conductive gas after processing and prior to the removal of the substrate by the moveable support.

17. The thermal processing system of claim 10, wherein the processing temperature is at least 800 degrees Celsius.

18. The thermal processing system of claim 10, wherein the temperature of the transitional region is from about 100 to 300 degrees Celsius less than the processing temperature.

19. The thermal processing system of claim 10, further comprising a gas supply for providing gas to the processing chamber and an exhaust for removing gas from the processing chamber;
    wherein the gas supply provides a conductive gas to the processing chamber for processing; and
    wherein the exhaust removes at least a portion of the conductive gas after processing and prior to the removal of the substrate by the moveable support.

20. A method for processing a semiconductor substrate comprising:
    positioning the substrate in a processing chamber adjacent to a heated surface;
    heating the substrate to a processing temperature;
    providing a transitional region in the processing chamber with a temperature less than the processing temperature; and
    removing the substrate from the region adjacent to the heated surface horizontally along a plane substantially parallel to the heated surface transitional region.

21. The method of claim 20 further comprising:
    providing a cooling surface in the processing chamber having a temperature less than the transitional heater;
    positioning the substrate adjacent to the cooling surface for cooling after the step of removing the substrate from the region adjacent to the heated surface through the transitional region.

22. The method of claim 21, wherein the processing temperature is at least 800 degrees Celsius and the temperature of the transitional region is from about 100 to 300 degrees Celsius less than the processing temperature.

23. A method for processing a semiconductor substrate comprising:
    positioning the substrate in a processing chamber adjacent to a heated surface;
    heating the substrate to a processing temperature;
    providing a transitional region in the processing chamber with a temperature less than the processing temperature; and
    removing the substrate from the region adjacent to the heated surface laterally along a plane substantially parallel to the heated surface and through the transitional region;
       wherein the step of removing the substrate further comprises rotating a susceptor supporting the substrate.

24. The method of claim 20, wherein the processing temperature is at least 800 degrees Celsius.

25. The method of claim 20, wherein the temperature of the transitional region is from about 100 to 300 degrees Celsius less than the processing temperature.

26. The method of claim 20, further comprising supplying a conductive gas to the processing chamber for processing; and
    exhausting at least a portion of the conductive gas after processing and prior to the step of removing the substrate.

27. A thermal processing system for processing a semiconductor substrate, the thermal processing system comprising:
    a processing chamber;
    a heater within the processing chamber;
    a support for positioning the substrate adjacent to the heater for processing the substrate;
    a transitional heater within the processing chamber providing a transitional region with a temperature less than the processing temperature; and
    a robot for removing the substrate from the support after processing;

wherein the robot is configured to remove the substrate from the region adjacent to the heater through the transitional region, along a plane substantially parallel to the heater, while maintaining the substrate in an orientation that is substantially parallel to the heater and the transitional heater.

28. The thermal processing system of claim 27, wherein the transitional heater comprises an active heater.

29. The thermal processing system of claim 27, wherein the transitional heater comprises thermal insulation.

30. The thermal processing system of claim 27, further comprising a warm heater having a temperature less than the transitional heater and a second support for positioning the substrate adjacent to the warm heater after processing;
wherein the robot places the substrate on the warm heater for cooling after removing the substrate from the region adjacent to the heater through the transitional region.

31. The thermal processing system of claim 30, wherein the processing temperature is at least 800 degrees Celsius and the temperature of the transitional region is from about 100 to 300 degrees Celsius less than the processing temperature.

32. The thermal processing system of claim 31, further comprising a gas supply for providing gas to the processing chamber and an exhaust for removing gas from the processing chamber;
wherein the gas supply provides a conductive gas to the processing chamber for processing the substrate; and
wherein the exhaust removes at least a portion of the conductive gas after processing and prior to the removal of the substrate by the robot.

33. The thermal processing system of claim 27, wherein the processing temperature is at least 800 degrees Celsius.

34. The thermal processing system of claim 27, wherein the temperature of the transitional region is from about 100 to 300 degrees Celsius less than the processing temperature.

35. The thermal processing system of claim 27, further comprising a gas supply for providing gas to the processing chamber and an exhaust for removing gas from the processing chamber;
wherein the gas supply provides a conductive gas to the processing chamber for processing the substrate; and
wherein the exhaust removes at least a portion of the conductive gas after processing and prior to the removal of the substrate by the robot.

36. A method for processing a semiconductor substrate comprising the steps of:
positioning the substrate in a processing chamber adjacent to a heater;
heating the substrate to a processing temperature;
providing a transitional region in the processing chamber with a temperature less than the processing temperature; and
removing the substrate from the region adjacent to the heater laterally along a plane that is substantially parallel to the heater;
wherein the substrate is maintained in an orientation that is substantially parallel to the heater while the substrate is being heated to the processing temperature; and
wherein the substrate is maintained in an orientation that is substantially parallel to the heater while it is being removed through the transitional region.

37. The method of claim 36 further comprising the steps of:
providing a warm heater in the processing chamber having a temperature less than the transitional heater;
positioning the substrate adjacent to the warm heater for cooling the substrate after the step of removing the substrate from the region adjacent to the heater through the transitional region.

38. The method of claim 37, wherein the processing temperature is at least 800 degrees Celsius and the temperature of the transitional region is from about 100 to 300 degrees Celsius less than the processing temperature.

39. The method of claim 36, wherein the processing temperature is at least 800 degrees Celsius.

40. The method of claim 36, wherein the temperature of the transitional region is from about 100 to 300 degrees Celsius less than the processing temperature.

41. The method of claim 36, further comprising the steps of:
supplying a conductive gas to the processing chamber for processing;
exhausting at least a portion of the conductive gas after processing; and
exhausting at least a portion of the conductive gas prior to the step of removing the substrate.

42. A thermal processing system for processing a semiconductor substrate, the thermal processing system comprising:
a processing chamber;
a heater within the processing chamber;
a susceptor within the processing chamber for positioning the substrate adjacent to the heater for processing the substrate; and
a transitional heater within the processing chamber providing a transitional region with a temperature less than the processing temperature;
wherein the susceptor is configured to rotate such that the substrate is removed from the region adjacent to the heater through the transitional region along a plane substantially parallel to the heater.

43. The thermal processing system of claim 42, wherein the transitional heater comprises an active heater.

44. The thermal processing system of claim 42, wherein the transitional heater comprises thermal insulation.

45. The thermal processing system of claim 42, further comprising a warm heater having a temperature less than the transitional heater;
wherein the susceptor is further configured to position the substrate adjacent to the warm heater for cooling the substrate after the substrate has been removed from the region adjacent to the heater.

46. The thermal processing system of claim 45, wherein the processing temperature is at least 800 degrees Celsius and the temperature of the transitional region is from about 100 to 300 degrees Celsius less than the processing temperature.

47. The thermal processing system of claim 46, further comprising a gas supply for providing gas to the processing chamber and an exhaust for removing gas from the processing chamber;
wherein the gas supply provides a conductive gas to the processing chamber for processing the substrate; and
wherein the exhaust removes at least a portion of the conductive gas after processing and prior to the removal of the substrate by the susceptor.

48. The thermal processing system of claim 42, wherein the processing temperature is at least 800 degrees Celsius.

49. The thermal processing system of claim 42, wherein the temperature of the transitional region is from about 100 to 300 degrees Celsius less than the processing temperature.

50. The thermal processing system of claim 42, further comprising a gas supply for providing gas to the processing chamber and an exhaust for removing gas from the processing chamber;

wherein the gas supply provides a conductive gas to the processing chamber for processing the substrate; and wherein the exhaust removes at least a portion of the conductive gas after processing and prior to the removal of the substrate by the susceptor.

51. The thermal processing system of claim 42, wherein the rotatable susceptor comprises a material selected from the group consisting of opaque quartz, transparent quartz, and silicon.

52. A method for processing a semiconductor substrate comprising the steps of:

positioning the substrate in a processing chamber and on a susceptor that is adjacent to a heater;

heating the substrate to a processing temperature;

providing a transitional region in the processing chamber with a temperature less than the processing temperature; and rotating the susceptor such that the substrate is removed from the region adjacent to the heater along a plane that is substantially parallel to the heater.

53. The method of claim 52 further comprising the steps of:

providing a warm heater in the processing chamber having a temperature less than the transitional heater;

positioning the substrate adjacent to the warm heater for cooling the substrate after the step of removing the substrate from the region adjacent to the heater through the transitional region.

54. The method of claim 53, wherein the processing temperature is at least 800 degrees Celsius and the temperature of the transitional region is from about 100 to 300 degrees Celsius less than the processing temperature.

55. The method of claim 52, wherein the processing temperature is at least 800 degrees Celsius.

56. The method of claim 52, wherein the temperature of the transitional region is from about 100 to 300 degrees Celsius less than the processing temperature.

57. The method of claim 52, further comprising the steps of:

supplying a conductive gas to the processing chamber for processing;

exhausting at least a portion of the conductive gas after processing; and exhausting at least a portion of the conductive gas prior to the step of removing the substrate.

* * * * *